(12) United States Patent
    Rutherford

(10) Patent No.: US 8,278,828 B1
(45) Date of Patent: Oct. 2, 2012

(54) LARGE AREA ORGANIC LED DISPLAY

(75) Inventor: James C. Rutherford, Fort Wayne, IN (US)

(73) Assignee: Imaging Systems Technology, Toledo, OH (US)

( * ) Notice: Subject to any disclaimer, the term of this patent is extended or adjusted under 35 U.S.C. 154(b) by 341 days.

(21) Appl. No.: 12/775,529

(22) Filed: May 7, 2010

Related U.S. Application Data

(63) Continuation-in-part of application No. 11/744,246, filed on May 4, 2007, now Pat. No. 7,714,514, which is a continuation-in-part of application No. 11/065,157, filed on Feb. 25, 2005, now Pat. No. 7,808,451, which is a continuation-in-part of application No. 10/277,500, filed on Oct. 22, 2002, now Pat. No. 6,861,810.

(60) Provisional application No. 60/335,216, filed on Oct. 23, 2001, provisional application No. 60/797,692, filed on May 5, 2006.

(51) Int. Cl.
    *G09G 3/10* (2006.01)
(52) U.S. Cl. .............. 315/169.3; 315/169.1; 315/169.4
(58) Field of Classification Search .................... None
    See application file for complete search history.

(56) References Cited

U.S. PATENT DOCUMENTS

| | | | |
|---|---|---|---|
| 4,134,132 A | 1/1979 | Magos et al. | |
| 5,828,181 A | 10/1998 | Okuda | |
| 6,084,579 A | 7/2000 | Hirano | |
| 6,542,138 B1 | 4/2003 | Shannon et al. | |
| 6,861,810 B2 | 3/2005 | Rutherford | |
| 7,714,514 B1 | 5/2010 | Rutherford | |
| 7,808,451 B1 | 10/2010 | Rutherford | |
| 2001/0001050 A1 | 5/2001 | Miyashita et al. | |
| 2001/0054711 A1 | 12/2001 | Numao | |
| 2002/0167474 A1 | 11/2002 | Everitt | |
| 2006/0186512 A1 | 8/2006 | Dekker et al. | |
| 2009/0096770 A1* | 4/2009 | Kawabe .................. | 345/204 |

* cited by examiner

*Primary Examiner* — Anh Tran
(74) *Attorney, Agent, or Firm* — Donald K. Wedding

(57) ABSTRACT

An active matrix organic LED display having a matrix of multiple light emitting pixels and electronic drive circuitry for selectively addressing the pixels, each pixel containing an organic LED. The electronic drive circuitry includes row scan electrodes and column data electrodes that interconnect the matrix of pixels. The circuitry also includes a MEMS switching device and a memory capacitor for each pixel, the MEMS switching device connecting the memory capacitor to a column data electrode during addressing of a pixel and connecting the memory capacitor to the organic LED of each pixel during light emission.

20 Claims, 6 Drawing Sheets

LARGE AREA ORGANIC LED DISPLAY

RELATED APPLICATIONS

This is a continuation-in-part under 35 U.S.C. 120 of copending U.S. patent application Ser. No. 11/744,246, filed May 4, 2007, with priority claimed under 35 U.S.C. 119(e) of Provisional Application 60/797,692 filed May 5, 2006, to issue as U.S. Pat. No. 7,714,514 which is a continuation-in-part under 35 U.S.C. 120 of U.S. patent application Ser. No. 11/065,157 filed Feb. 25, 2005, now U.S. Pat. No. 7,808,451 which is a continuation-in-part under 35 U.S.C. 120 of U.S. patent application Ser. No. 10/277,500, filed Oct. 22, 2002 with priority claimed under U.S.C. 119(e) of Provisional Application 60/335,216 filed Oct. 23, 2001, now U.S. Pat. No. 6,861,810.

INTRODUCTION

The present invention relates generally to an organic electroluminescent (EL) device and more particularly to a driving method and apparatus for such a device. This active matrix drive method works for all known types of light-emitting diodes (LED) whose emission electroluminescent layer comprises a film of organic compounds. Examples of different types are small-molecule OLED (SMOLED), polymer light-emitting diodes (PLED), and phosphorescent OLED (PHOLED).

BACKGROUND

There are two types of organic electroluminescent (EL) display devices, passive (simple matrix) organic EL and active matrix organic EL. Organic EL materials are divided into low molecular weight organic EL materials and high molecular weight (polymer) organic EL materials. Low molecular weight organic EL materials are mainly applied by evaporation to the substrate. High molecular weight or polymer organic EL materials are applied by ink jet printing or similar techniques.

The active matrix drive method works for all known types of light-emitting diodes (LED) whose emission electroluminescent layer comprises a film of organic compounds. Examples of different types are small-molecule OLED (SMOLED), polymer light-emitting diodes (PLED) and phosphorescent OLED (PHOLED).

Small molecule organic EL substances are disclosed in U.S. Pat. Nos. 4,720,432 (VanSlyke et al.), 4,769,292 (Tang et al.), 5,151,629 (VanSlyke), 5,409,783 (Tang et al.), 5,645,948 (Shi et al.), 5,683,823 (Shi et al.), 5,755,999 (Shi et al.), 5,908,581 (Chen et al.), 5,935,720 (Chen et al.), 6,020,078 (Chen et al.), 6,069,442 (Hung et al.), 6,348,359 (VanSlyke et al.), and 6,720,090 (Young et al.), all incorporated herein by reference.

Large molecule or polymeric OLED substances are disclosed in U.S. Pat. Nos. 5,247,190 (Friend et al.), 5,399,502 (Friend et al.), 5,540,999 (Yamamoto et al.), 5,900,327 (Pei et al.), 5,804,836 (Heeger et al.), 5,807,627 (Friend et al.), 6,361,885 (Chou), and 6,670,645 (Grushin et al.), all incorporated herein by reference. The polymer light-emitting devices may be called PLED.

Organic luminescent substances also include OLEDs doped with phosphorescent compounds as disclosed in U.S. Pat. No. 6,303,238 (Thompson et al.), incorporated herein by reference. Organic photoluminescent substances are also disclosed in U.S. Patent Application Publication Nos. 2002/0101151 (Choi et al.), 2002/0063525 (Choi et al.), 2003/0003225 (Choi et al.), and 2003/0052596 (Yi et al.); U.S. Pat. Nos. 6,610,554 (Yi et al.) and 6,692,326 (Choi et al.); and International Publications WO 02/104077 and WO 03/046649, all incorporated herein by reference.

Active matrix organic LED devices are difficult to drive using simple two-terminal schemes because of their lack of memory. The rise and decay time of an organic LED device is very fast and it does not have intrinsic memory. To overcome this problem, thin-film-transistor (TFT) circuits have been developed to drive organic LED devices. Such circuits include four or more TFTs, a storage capacitor, and an organic LED pad arranged on a substrate. The storage capacitor enables the excitation power to an addressed organic LED element to stay on once it is selected.

While successfully overcoming the above mentioned problem, new problems in manufacturing are created. The storage capacitor process and deposition are very complicated and difficult to achieve in a fabrication process. The TFTs fabrication requires several mask steps whose difficulty and cost increase dynamically as the display size increases. If the substrate is plastic an expensive laser annealing process is used in fabrication of the TFT.

RELATED PRIOR ART

Electronic Circuitry

The following prior art relates to electronic circuitry for addressing an organic LED display and is incorporated herein by reference: U.S. Pat. Nos. 4,134,132 (Magos et al.), 5,828,181 (Okuda), 6,084,579 (Hirano), 6,356,029 (Hunter), 6,542,138 (Shannon et al.), 6,861,810 (Rutherford), and U.S. Patent Application Publication Nos. 2001/0001050 (Miyashita et al.), 2001/0054711 (Numao), 2002/0047839 (Kasai), 2002/0167474 (Everitt), 2003/0011960 (Koning et al.), and 2004/0084986 (Arbogast et al.).

SUMMARY OF INVENTION

Figure 1:
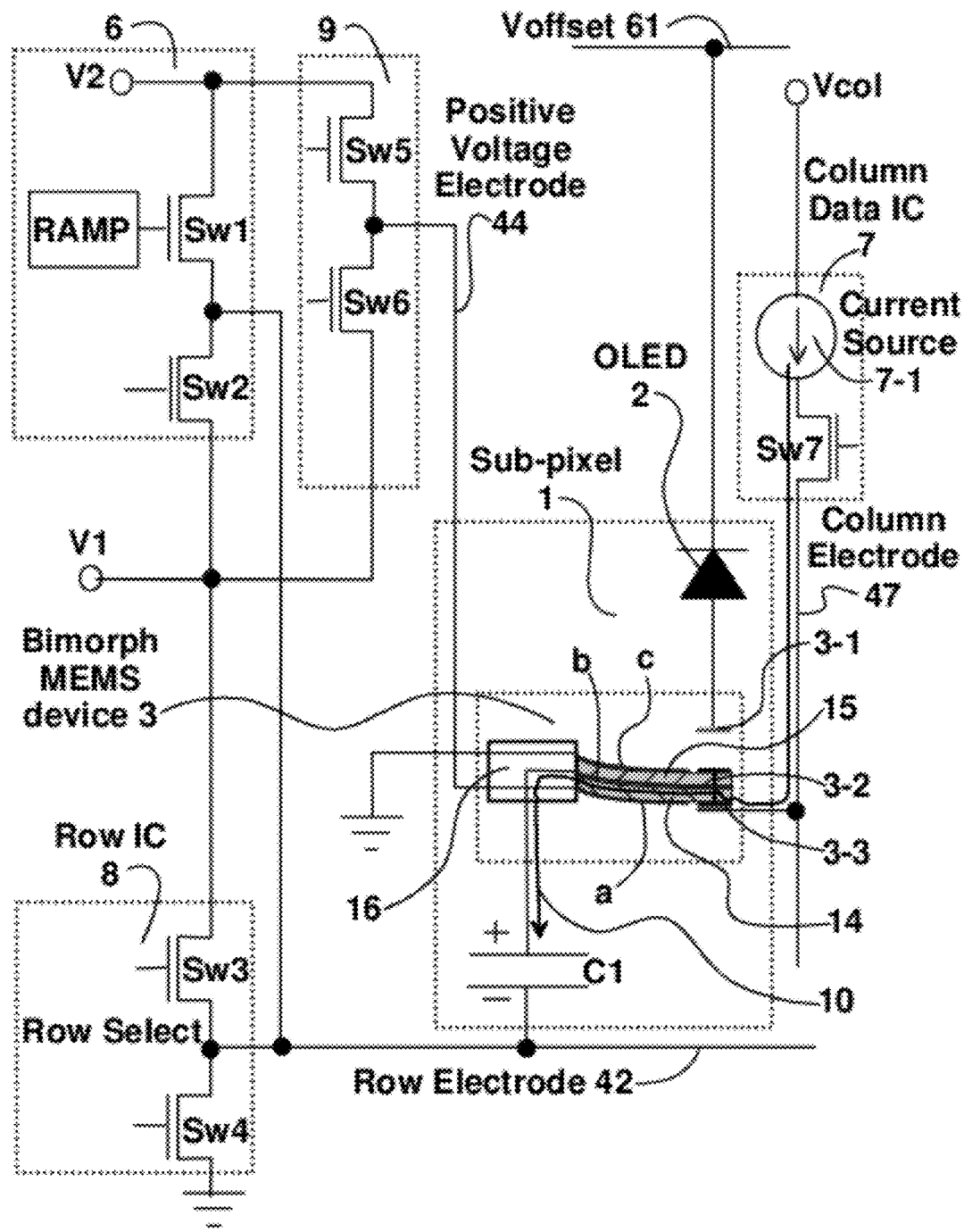
FIG. 1 is a circuit diagram of a capacitor current memory Bimorph MEMS device positioned for address period.

In accordance with this invention, there is provided a low power active matrix organic LED electroluminescent display device with a capacitor current memory circuit that enables increased component tolerances, and reduces problems caused by dimensional instability of plastic substrates. A Bimorph MEMS device connects a capacitor to the device's column electrode during the addressing period and to the organic LED electroluminescent device during light emission period.

DETAILED EMBODIMENTS

The capacitor current memory drive method and apparatus of this invention makes possible the low cost manufacture of very large area flexible substrate active matrix organic LED electroluminescent displays including HDTV. In accordance with this invention, display sizes up to 60 inches or more in diagonal can be manufactured. The three basic components in each of the sub-pixels that comprise this display are an organic LED electroluminescent (EL) device, a Bimorph MEMS device, and a memory capacitor. No TFTs are used or required in this active matrix drive method. Thus, some of the disadvantages associated with a TFT active matrix drive, such as more components in each pixel or sub-pixel, close manufacturing tolerances, and higher process temperatures are eliminated. All process temperatures for this display are low temperature and there are no destructive temperatures affecting manufacture on plastic substrates. Manufacturing non-uniformity has a much lesser effect on display brightness uniformity when using this structure compared to that of TFT circuits. The light output from the display is controlled by external ICs supplying a precise amount of charge to the memory capacitors. Because all of this charge is dissipated as forward current through the organic LED electroluminescent device, all pixels have the same light output even though there may be variations in the display's components. Variation in organic LED electroluminescent layer thickness across the display results in sub-pixels having different device threshold voltages. Adjustment to variation and/or changes in organic LED electroluminescent diode threshold voltage due to aging is automatic. Tolerances effecting a variation in sub-pixel size are automatically compensated by small changes in current density through the organic LED electroluminescent device. Therefore, because the display brightness uniformity is controlled by the charge stored in its memory capacitors, it is not necessary that manufacturing tolerances be as closely controlled as they are for the TFT drive method. Also, wide component tolerances helps in the manufacture of very large displays.

Low power results from row and column electrodes made of highly conductive opaque metal such as copper that minimizes the resistive losses in these electrodes. Energy stored in the Bimorph MEMS device during its operation is recovered in the memory capacitor. All charge added to the memory capacitor during the addressing period is used to produce light output. A ramp voltage applied to the memory capacitor controls a small forward current through the organic electroluminescent device. This results in an additional advantage in energy savings over that of the TFT drive method. In the TFT drive method forward current through the organic LED that produces the light output is dissipated to ground. In this drive method forward current through the organic LED is recovered in the $V_{offset}$ power supply. The result of this energy recovery is a power savings resulting in even higher luminescent efficiency than can obtain by the TFT drive method. This display is a front emission type and has a very large aperture ratio (>95%). Typically displays having very large aperture ratio can operate at a better luminous efficiency because of their lower current density.

This new drive method eliminates obstacles to the manufacture of small as well as very large area (60 inch or greater) HDTV organic LED electroluminescent displays on plastic substrates. It has the capability for manufacturing very large area low power organic LED electroluminescent displays with reduced cost and increased performance that cannot be matched by other active matrix drive methods.

DETAILED DESCRIPTION OF THE DRAWINGS

Capacitor Current Memory Drive

FIG. 1 shows the electrical equivalent circuit for driving a cathode front structure organic LED electroluminescent display. The front emissions display with capacitor current memory drive consists of Row Electrodes 42 connected to the memory capacitors C1 and driven by row ICs 8 with switches SW3 and SW4 and ramp circuit 6 with switches SW1 and SW2. Also shown are Positive Voltage Electrode 44 and Column Electrode 47. The constant current output from the Column Data IC 7 loads a specific amount of charge into the memory capacitors C1. The Column Data IC 7 includes a constant current source 7-1 and switch SW7. There is one common front electrode 61 ($V_{OFFSET}$) covering the entire front surface area of the display. This electrode 61 covers the entire front surface of all of the organic LED pixels so as to seal the front surface of the pixels from exposure to air and/or moisture. To prevent excessive reverse bias on the organic LED after completion of the Ramp Voltage 45 (illustrated in FIG. 4) portion of the waveform, a circuit 9 with switches SW5 and SW6 generates the Return to Center OFF Pulse 48 (illustrated in FIG. 4). This pulses the Bimorph MEMS device's 3 bottom electrode a and returns the device to its center OFF position (illustrated in FIG. 3). Also shown is top electrode c, which is grounded. The center electrode b is connected to the positive (+) lead of capacitor C1. Electrodes 42, 47, 61, and 44 interconnect the display sub-pixels components. Each basic sub-pixel 1 has an organic LED electroluminescent device 2, a Bimorph MEMS device 3 and a simple capacitor C1 used as a memory device. Dependent upon the orientation of the sub-pixel components, this front emission display can have either the organic LED electroluminescent device cathode or anode to its front as disclosed in U.S. Pat. No. 6,861,810 (Rutherford), cited above and incorporated herein by reference.

Figure 3:
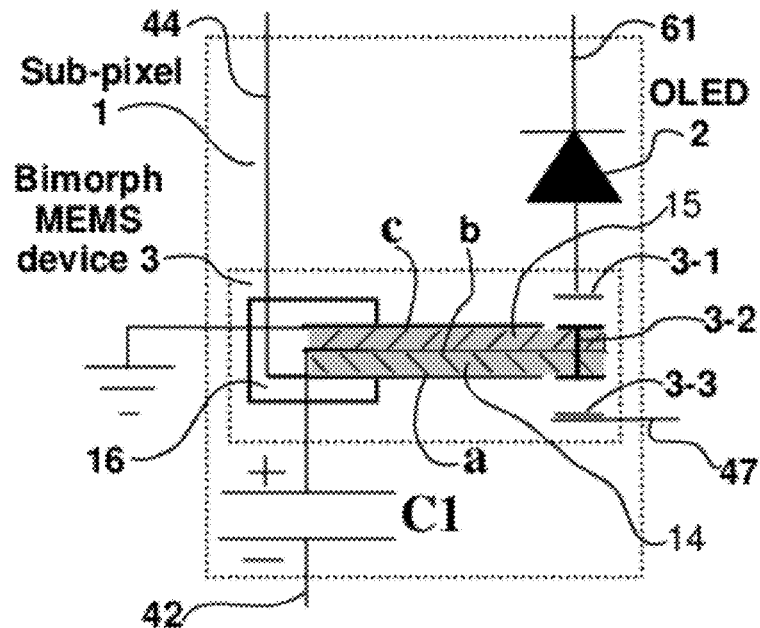
FIG. 3 is a circuit diagram of a sub-pixel for a Bimorph MEMS device in its OFF position.

As shown in FIG. 1 the Bimorph MEMS device 3 is positioned for the address period. A mounting block 16 supports the bimorph MEMS device 3. Pad 3-2 makes contact to pad 3-3 during the address period 43 (illustrated in FIG. 4) and to pad 3-1 during the light emission period during ramp voltage 45 (illustrated in FIG. 4). The arrowed line 10 is the current path from the Column Data IC Constant Current Source 7-1 to the Column Electrode 47, through the Bimorph MEMS device 3 center electrode b, then to the memory capacitor C1. The charge stored in C1 is for one video frame. The amount of charge determines the gray scale level for this sub-pixel. As illustrated in FIG. 3, after the address period 43 (illustrated in FIG. 4), the Bimorph MEMS device 3 is repositioned to its center OFF position.

Figure 2:
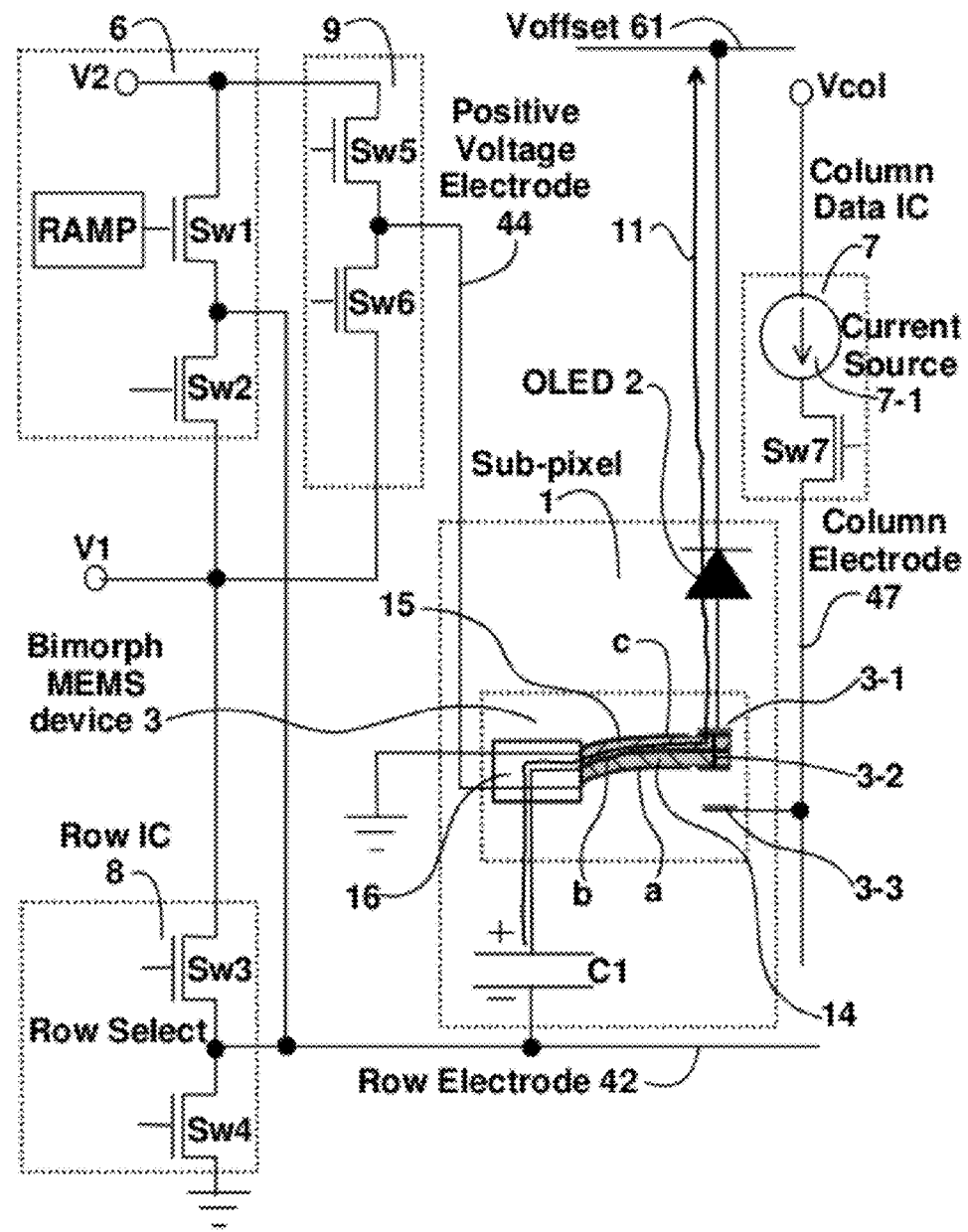
FIG. 2 is a circuit diagram of a capacitor current memory Bimorph MEMS device positioned for light emission.

Shown in FIG. 2 is an arrowed line 11 that follows the current path of memory capacitor C1 discharge. The discharge is from C1, through Bimorph MEMS device 3 center electrode b, which is now positioned pad 3-2 to pad 3-1 connecting to the organic LED device 2. The current path 11 continues through the organic LED device 2 to the $V_{OFFSET}$ 61. A ramp voltage on the Row Electrode 42 controls the rate of capacitor C1's discharge through the organic LED device 2. Also, a voltage equal to the Ramp Voltage 45, shown in FIG. 4 plus the voltage from the charge stored in C1, during the addressing period 43, is applied to the Bimorph MEMS device 3 center electrode b. As the voltage increases a level is reached that determines when the Bimorph MEMS device 3 repositions from its center OFF position to the organic LED 2 position as shown in FIG. 2. This process controls the amount of reverse bias voltage that is applied to the organic LED 2 and can be from none to some desired amount. The effect upon the organic LED 2 is a small constant current until the end of the ramp voltage 45, at which time the charge stored in the memory capacitor C1 from the Column Data IC 7 is dissipated. Therefore, the total light emission during this frame time is directly proportional to the amount of charge stored in the memory capacitor C1 during the Address Period 43 in FIG. 4.

Bimorph MEMS Device

Recent advances in electron-irradiated copolymer poly (vinylidene fluoride-trifluoroethyline) exhibit large energy density and recoverable strains up to 4%. See U.S. Patent Application Publication 2004/0084986 (Arbogast et al.), cited above and incorporated herein by reference. Another novel electromechanical device is ionic polymer metal composite materials. Bimorph actuation of systems utilizing high-density electrostrictive materials presents a compound actuator system. As illustrated in FIG. 3 the Bimorph MEMS device 3 is mounted on mounting block 16. The first 14 and second 15 electrostrictive layers are positioned between the a, b, c electrodes of the Bimorph MEMS device 3. The electrodes a, b, c may be any suitable electrical conductor (gold, copper or aluminum). The electrodes a, b, c may be sheet conductors, or may be conductors that are sputtered or chemically vapor-deposited on the electrostrictive layers 14, 15. As illustrated in FIG. 3 when the voltage across both electrostrictive layers 14, 15 is equal, the Bimorph MEMS device 3 is in the center OFF position. As illustrated in FIG. 1 when the voltage across electrodes a and b is greater than the voltage across electrodes b and c, then the electrostrictive layer 14 between electrodes a and b constricts and positions the Bimorph MEMS device 3 connecting the memory capacitor C1 to the Column Data Electrode 47. As illustrated in FIG. 2 when the voltage across electrodes b and c is greater than the voltage across electrodes a and b, the electrostrictive layer 15 between electrodes b and c constricts and positions the Bimorph MEMS device 3 to connect memory capacitor C1 to the organic LED device 2.

Voltage Waveforms

Figure 4:
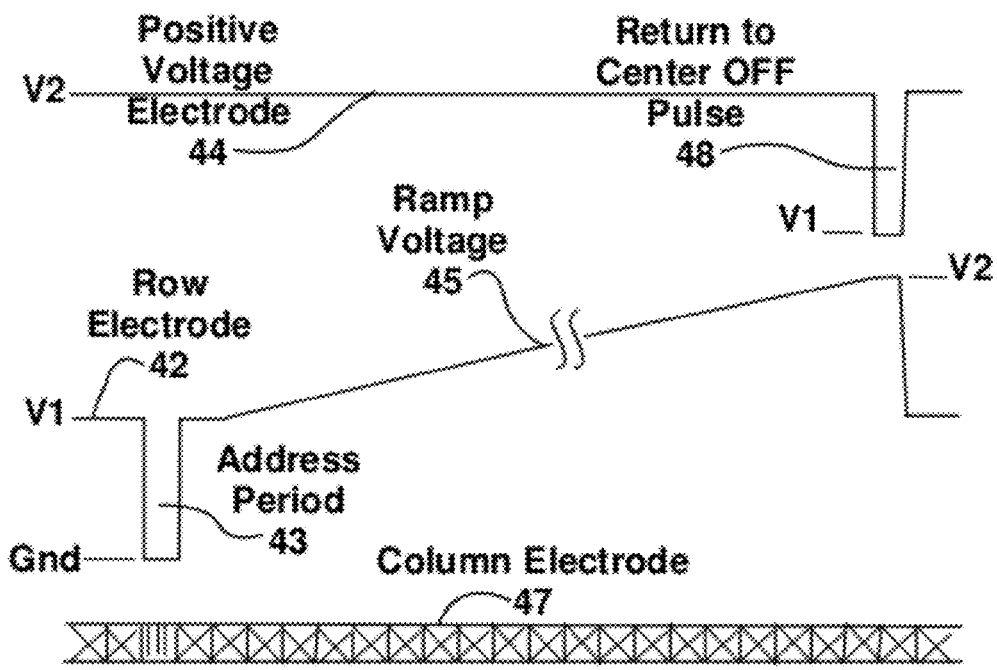
FIG. 4 is a diagram of electrode waveforms.

The voltage waveforms of FIG. 4 are for the Row Electrode 42, Positive Voltage Electrode 44 and Column Electrode 47. The waveforms have a period of time in which the Bimorph MEMS device 3 (FIG. 3) is in the center OFF position, an Addressing Period 43 in which the Bimorph MEMS device 3 (FIG. 3) is positioned to contact the memory capacitor C1 (FIG. 1) and light output period during the Ramp Voltage 45 in which the Bimorph MEMS device 3 (FIG. 3) repositions from the center OFF position to a position making contact to the organic LED device 2 (FIG. 2). During the Addressing Period 43, the SW4 (FIG. 1) is ON and grounds the Row Electrode 42, the result is that the voltage across electrodes a and b is greater than the voltage across electrodes b and c and the Bimorph MEMS device 3 (FIG. 3) is positioned to connect the Column Electrode 47 to the memory capacitor C1 (FIG. 1). This enables charge to be stored in memory capacitor C1 (FIG. 1). The amount of charge added to the memory capacitor C1 (FIG. 1) will result in the desired light output. Charging is stopped by the pulse width modulation (not shown) of Column Data IC 7 (FIG. 1) turning SW 7 OFF. At the end of the Address Period 43 the Row Electrode 42 Waveform steps voltage to V1 such that the voltage across a and b is equal to the voltage across b and c which returns the Bimorph MEMS device 3 (FIG. 3) to the center OFF position. As the Ramp Voltage 45 increases the voltage applied to the Bimorph MEMS device 3 (FIG. 3), center electrode b increases. This center electrode voltage is the sum of the Ramp Voltage 45 plus the voltage level in the memory capacitor C1 (FIG. 3) due to the amount of charge stored in C1 (FIG. 3). When the voltage across electrode b and c reaches a certain level greater than the voltage across electrodes a and b, the Bimorph MEMS device 3 (FIG. 3) repositions from the center OFF position to the organic LED position as discussed for FIG. 2. At this time the increasing Ramp Voltage 45 forces the discharge of capacitor C1 through the organic LED 2 (FIG. 2).

The small forward current level through the organic LED 2 (FIG. 2) is controlled by an equilibrium condition created when the rate of reduction of the C1 voltage due to discharge, is equal to the rate of voltage rise of the Ramp Voltage 45. At the end of the ramp period, the discharge of C1 stops when its voltage has been reduced to a level that is equal to the organic LED 2 (FIG. 2) threshold voltage. Therefore, the spatial charge voltage remaining on the memory capacitor C1 is indicative of the organic LED 2 (FIG. 2) threshold voltage. The result is each sub-pixel has its own memory for its organic LED 2 (FIG. 2) threshold voltage. In subsequent frames, charge is added to the memory capacitor C1, which is used to produce the desired light output. At the end of the Ramp Voltage 45 a Return to Center OFF Pulse 48 helps return the Bimorph MEMS device 3 (FIG. 3) to its center OFF position before the Ramp Voltage 45 steps down from V2 to V1. This prevents a reverse bias voltage on the organic LED during this step down in voltage.

Ionic Polymer Metal Composites (IPMC) MEMS Device

An IPMC has two parallel electrodes and electrolyte between the electrodes. For this invention an electro-active solid-state actuator comprising a solid polymer electrolyte film having first and second main surfaces facing each other, and first and second conductive polymer layers infiltrated into the first and second main surfaces of the solid polymer electrolyte film.

Figure 5:
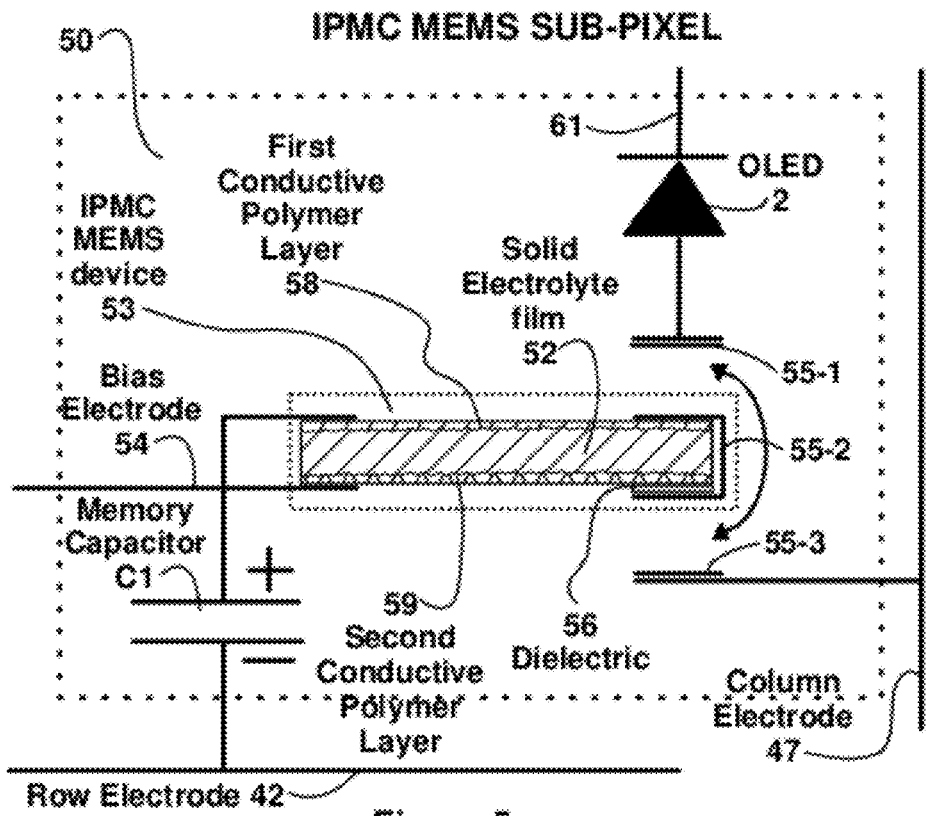
FIG. 5 is a circuit diagram of a sub-pixel for an IPMC MEMS.

FIG. 5 illustrates a sub-pixel 50 using the IPMC MEMS device 53. When the voltage is applied from memory capacitor C1 and the bias electrode 54, the First Conductive Polymer Layer 58 and Second Conductive Polymer Layer 59 are caused to be polar. Further, the cationic component of the Solid Electrolyte Film 52 is shifted to Conductive Polymer Layer 58 or 59 as a cathode. Thereby, expansion occurs at the electrolyte portion adjacent to the Conductive Polymer Layer 58 or 59, while constriction occurs at the electrolyte portion adjacent to the other Conductive Polymer Layer. Thus, curvature toward the other Conductive Polymer Layer takes place. Also shown is FIG. 5 is Pad 55-1 for connection to organic LED 2 (FIG. 5), Pad 55-2 for connection to First Conductive Polymer Layer 58 and Pad 55-3 for connection to Column Electrode 47. Dielectric 56 isolates 55-2 from Second Conductive Polymer Layer 59.

Figure 6:
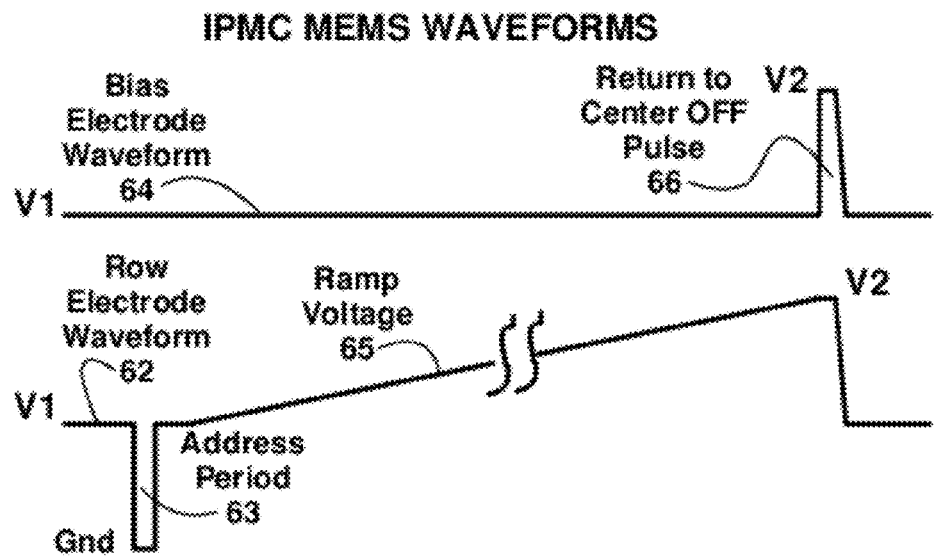
FIG. 6 is a diagram of IPMC MEMS electrode waveforms.

FIG. 6 illustrates the voltage waveforms controlling the IPMC MEMS device 53 (FIG. 5). When both the Bias Electrode waveform 64 and Row Electrode waveform 62 are at voltage V1, the IPMC MEMS 53 (FIG. 5) device is in its center OFF position. During the Address Period 63 the Row Electrode 42 grounds memory capacitor C1 (FIG. 5) and the Bias Electrode waveform 64 is at V1. In this case the memory capacitor C1+voltage to First Conductive Polymer Layer 58 (FIG. 5) results in expansion of the solid electrolyte film at this electrode and constriction at 59. Thus, curvature to the Column Electrode 47 takes place to make the connection between the Column Electrode 47 (FIG. 5) and Memory Capacitor C1. After the Address Period 63, the voltage applied to the First Conductive Polymer Layer 58 is the charge stored in the Memory Capacitor C1 (FIG. 5) plus the voltage level due to increasing Ramp Voltage 65 (FIG. 6).

When the voltage level is reached such that the constriction of the Solid Electrolyte Film 52 (FIG. 5) at the Memory Capacitor C1 (FIG. 5) and the expansion at the Bias Electrode 54 (FIG. 5) results in enough curvature to make contact to the Pad 55-1 and organic LED 2 (FIG. 5). The Memory Capacitor C1 then discharges through the organic LED 2 (FIG. 5) while the current level is controlled by the rate of Voltage Ramp 65 increase. At the end of the Ramp Voltage 65 a Return to Center OFF Pulse 66 helps return the IPMC MEMS device to its center OFF position before the Ramp Voltage goes down from V2 to V1. This prevents a reverse bias of the organic LED 2 (FIG. 5).

Single Substrate Structure

Figure 7:
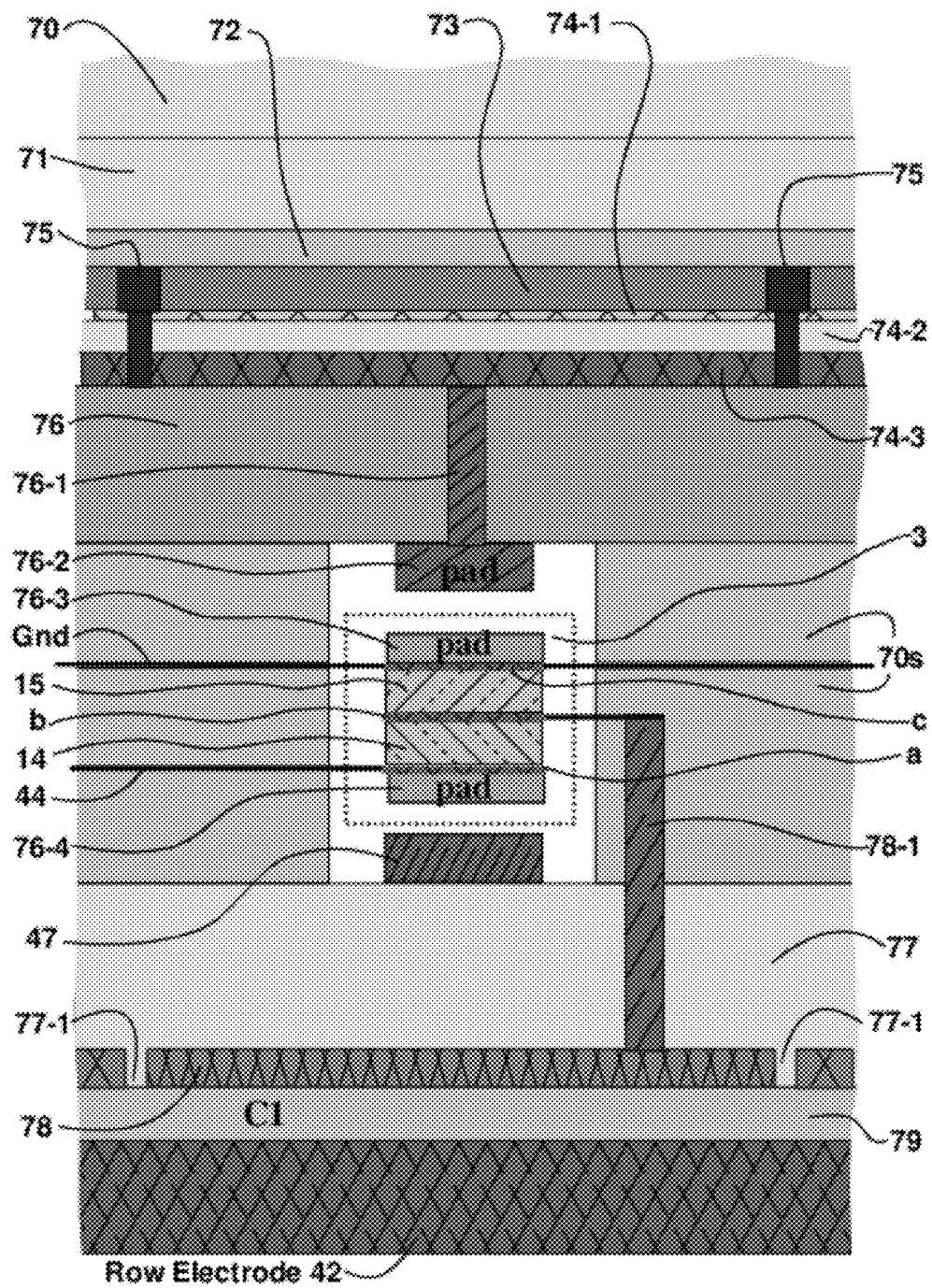
FIG. 7 is a sub-pixel one plastic sheet structure top edge view.

The structure for the organic LED electroluminescent display can have all its components located on its topside or on both sides of a single substrate 76 such as a plastic sheet. Illustrated in FIG. 7 is one sub-pixel whose components are on both sides of a single substrate 76. On the topside are the protective cover 70, buffer layer 71, translucent or transparent electrode layer 72, organic luminescent layers 73, and optical trap consisting of a thin metal layer 74-1, a transparent conductive layer 74-2, organic LED anode electrode 74-3. A plated through hole 76-1 makes connection between anode electrode 74-3 to bottom side of plastic substrate 76 pad 76-2. The electrode 72 can be a cathode or an anode depending on the configuration. On the bottom side are the Bimorph MEMS device 3 (FIG. 7) and memory capacitor C1. This display is a top emission type and in the figure the organic LED cathode is to the front. However, by changing the orientation of components and waveforms the organic LED anode electrode can be to the front.

In the display's plastic substrate 76, each sub-pixel has a plated through hole 76-1, which makes the electrical connection between the top and bottom surfaces. Metal on the topside is formed into the shape of the organic LED anode electrodes 74-3. A metal pad 76-2 on the bottom side is for contact to the Bimorph MEMS device 3 (FIG. 7) pad 76-3.

The topside processes begin with a destructive-interference contrast-enhancement stack. This stack has three layers consisting of the anode electrode 74-3, transparent layer 74-2 and thin metal layer 74-1 that are formed into the shape of the sub-pixel. These layers also serve as the anode electrode for the organic light-emitting device. Next partitioning walls 75 (banks) are formed to fill the spaces between the sub-pixel electrodes. The organic luminescent layers 73 are formed in vertical strips of red, green, and blue color. The cathode layer 72 covers the entire front surface area of the display. A buffer layer 71 covers the electrode layer 72. Finally the cover layer 70 seals the display. To be noted the anode electrode 74-3 is flat, therefore the organic luminescent layers have a flat surface to be formed upon. As stated earlier the display can also be configured as a top emission type with the anode to the front. These different structure types for this display apparatus are discussed in previous papers.

Next testing of the organic electroluminescent layers selects reliable devices and the display process is continued. For those rejected displays, processing is discontinued, which results in a cost saving.

The bottom side processing continues with a spacer layer 70s with an open area for the Bimorph MEMS device 3 (FIG. 7). The first part of the open area is filled with a temporary material.

Then a metal pad 76-3 and c electrode are formed. A ground electrode is formed on the spacer layer. A second electrostrictive layer 15 is added to the c electrode. A spacer layer (not shown) equal to the thickness of the electrostrictive layer is added. A b electrode is formed on the second electrostrictive material 15 and also, extends to a plated through hole 78-1. A first electrostrictive layer 14 is formed on the b electrode. A spacer layer (not shown) equal to the first electrostrictive layer 14 is added. The a electrode and pad 76-4 is formed on the first electrostrictive material 14. The pad 76-4 is used to make contact to the column electrode 47. The temporary material (not shown) under the c electrode is removed by under etching. A positive voltage electrode 44 is formed on the spacer layer and makes connection to the a electrode. An insulating film 77 fills the area between the spacer layer 70s and the metal for the Memory Capacitor C1 second electrode 78 which is deposited and formed into the shape of a sub-pixel. A space 77-1 between second electrodes 78 isolates each C1. A memory capacitor dielectric layer 79 covers the entire surface. See U.S. Patent Application Publication 2003/0011960 (Koning et al.), incorporated herein by reference. Also see Y. Bai, Z.-Y. Cheng, V. Bharti, H. S. Xu, and Z. M. Zhang, "High-dielectric-constant ceramic-powder polymer composites", Appl. Phys. Lett., Vol. 76, No. 25, 2000., cited above and incorporated herein by reference. Metal is deposited on the dielectric surface and formed into horizontal row electrodes 42 (memory capacitor first electrode). The memory capacitor second electrode 78, memory capacitor dielectric 79 and row electrode 42 make memory capacitor C1. This completes the components on the bottom side.

Dual Substrate Structure

Figure 8:
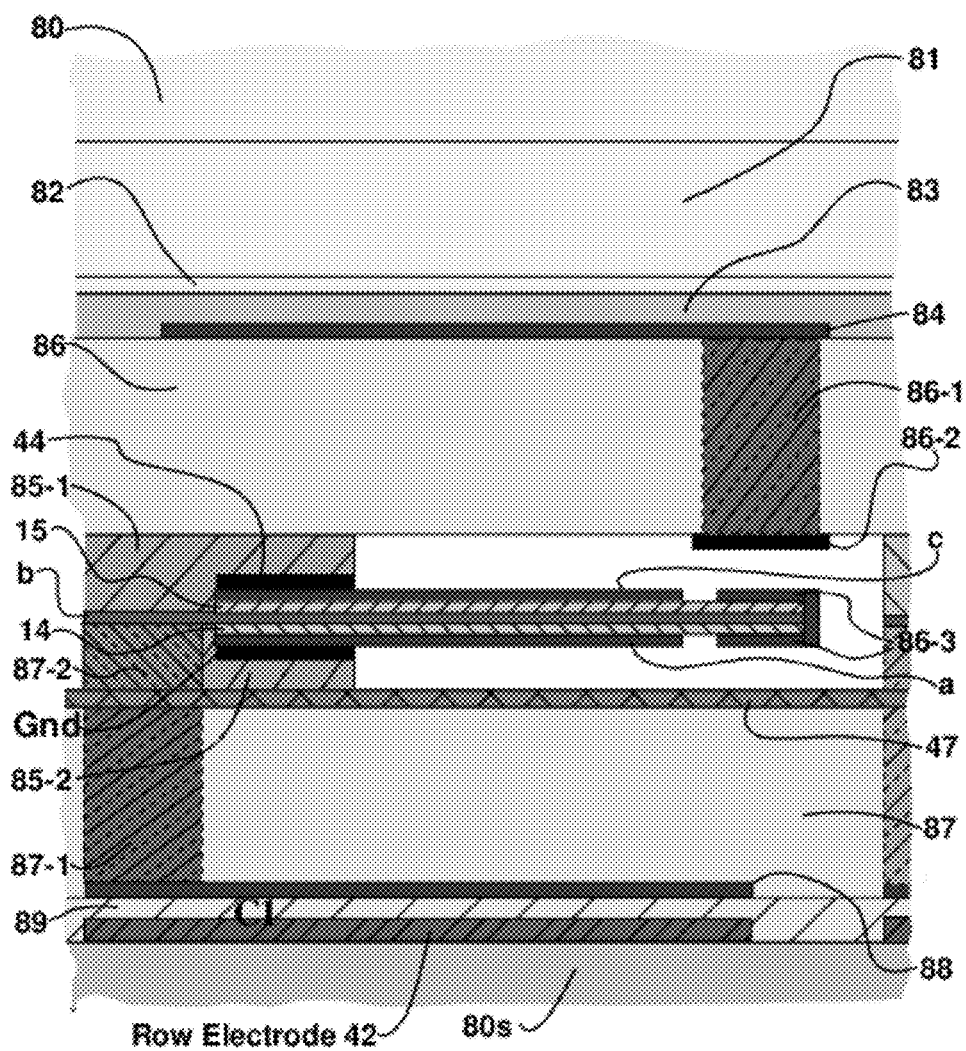
FIG. 8 is a sub-pixel two plastic sheet structure side edge view.

The dual substrate structure is such that manufacturing can be performed on three separate parts of the display simultaneously. Shown in FIG. 8 is the structure for a side view of a pixel.

The Memory Capacitor C1 is on the substrate 80s. Row electrodes 42 are formed on the substrate 80s. These electrodes also serve as the memory capacitors C1 first electrode. A dielectric layer 89 is formed covering the entire display area of the substrate. A metal for the memory capacitors second electrode 88 is deposited upon the dielectric layer and then formed into its sub-pixel shape. The processing of the Row Electrode 42, Memory Capacitor dielectric 89 and Memory capacitor second electrode 88 completes Memory Capacitor C1.

The first plastic substrate 87 such as a plastic sheet has interconnects for the memory capacitors second electrode 88. It also has the MEMS device and its mounting. A conductive through hole 87-1 for each sub-pixel makes the electrical connection from the memory capacitor C1 second electrode 88 to the topside of the plastic sheet 87. Vertical column data electrodes 47 are formed on this topside. A nonconductive material 85-2 is formed in horizontal strips across the first plastic substrate 87. An opening is maintained at the through hole location 87-1. A ground electrode is formed on top of the horizontal stripe 85-2. Also, during this process metal 87-2 from the through hole 87-1 to the top of the horizontal stripe makes an electrical conductor for the MEMS device center electrode b. The elements of the MEMS device are formed on a transfer substrate. The transfer substrate is moved to the first plastic sheet substrate 87 and the MEMS device is mounted upon the ground electrode. Conductive adhesive makes the electrical contact from ground electrodes to electrode a and metal 87-2 from through hole 87-1 to center electrode b of the MEMS device. The transfer substrate (not shown) is removed through a liftoff process, using radiation energy, such as from laser or other appropriate device. The positive voltage electrode 44 is formed across the display connecting to the c electrode of the MEMS device. A nonconductive spacer layer 85-1 is formed filling the space above the positive voltage electrode 44 and the horizontal strip-mounting layer 85-2. This completes the processing of the first plastic substrate 87.

The organic LED device is on the second plastic substrate 86. There is a conductive through hole 86-1 for each sub-pixel. On the bottom side, at the conductive through hole, is a pad 86-2 area used for contact to pad 86-3, which is connected to the cantilever Bimorph MEMS device center b electrode. The topside of the second plastic substrate begins with the anode electrode 84 for the organic light-emitting device connected to through hole 86-1. Next partitioning walls (banks not shown) are formed to fill the spaces between the sub-pixels electrodes. Organic luminescent layers 83 are formed in vertical strips of red, green, and blue color. A translucent or transparent electrode layer 82 covers the entire front surface display area. A buffer layer 81 covers the cathode layer. Finally the protective cover layer 80 is added to the front of the display. The electrode 82 can be a cathode or an anode depending on the configuration.

Mating the part with the MEMS device to the part with the memory capacitor and then the part with the organic LED device to the part with the MEMS device completes the assembly of the display.

Display Life

The efficiency and effectiveness of a display changes over time and the quality of the display, particularly for sensitive applications such as imaging, declines. This is due to changes over time in materials that comprise the display and degradation in electronic components.

This front emission type display has a very large aperture ratio. The resultant lower current density will increase life due to less heating of the organic LED element and less metal migration.

The organic LED electroluminescent layers reversed bias may be controlled to some desired amount. It is known that application of reverse bias to an organic LED electroluminescent element is an effective means to increase the life of the display. See U.S. Patent Application Publication 2002/0047839 (Kasai), cited above and incorporated herein by reference.

The spatial charge voltage on the memory capacitor is indicative of the threshold voltage of the organic LED device. It has been recognized that as the organic LED display elements degrade over time, their impedance increases and the potential difference between anode and cathode increases. The value of the change in potential difference provides a reasonable indication of the state of the element in terms of its light emission/drive current characteristic. See U.S. Pat. No. 6,356,029 (Hunter), cited above and incorporated herein by reference. Thus by using feedback of this voltage to adjust the amount of charge stored in each memory capacitor C1, compensation for temperature and aging degradation is possible.

Oxygen and moisture degradation to the organic LED is prevented with a metal electrode that completely covers the front surface of the organic LED and metal row scan electrodes that cover most of the rear surface of the organic LED with sealing of the small area between row scan electrodes and around the edge of the organic LED display.

Low Power

The prior art uses thin film transistors to create a constant current flow to the organic LED pixels. This energy (current flow) is typically not recovered after producing light output from the pixels and is dissipated to ground potential. In this invention, almost all of the energy used to drive the organic LED pixels is recovered in the power supply because of minimal resistive losses in the electronic drive circuitry. In the practice of this invention, the row and column electrodes are made of a highly conductive material including an opaque metal such as copper. A resistive loss in these electrodes is minimal. Much of the energy used to drive the organic LED electroluminescent display is restored to the power supply and recovered in the memory capacitor. For example the energy of the forward current through the organic LED during the light emission is recovered in the $V_{offset}$ power supply. Charge stored in the MEMS device is recovered in C1. These energy recovery methods result in significant reduction of power consumed by this display.

This display is a front emission type and has a very large aperture ratio. Displays having very large aperture ratio operate at an increased luminous efficiency because of lower current density.

Aperture Ratio is the ratio of the light emitting area to pixel area. In one embodiment hereof, the MEMS switching device and memory capacitor for each pixel are located on a different plane relative to the plane of the organic LED for the pixel so as to maximize the aperture ratio of the pixel. The prior art organic LED architectures use multiple thin film transistors for each pixel. In a bottom emission structure, the transistors for each pixel are located in the same plane as the organic LED and within the pixel area. This inclusion of the transistors as part of the pixel area decreases the light emitting area and the aperture ratio. In a top emission structure, the transistors are located beneath the organic LED. The top emission structure requires an insulating polarizing film to prevent non-uniform light emissions caused by level differences and uneven surfaces.

Wide Component Tolerance

Manufacturing non-uniformity has a lesser effect on display brightness uniformity, when using this structure compared to that of TFT circuits. The light output from the display is controlled by external ICs supplying a precise amount of charge to the memory capacitor C1. Because all of this charge is dissipated as forward current through the organic LED device, all pixels have the same light output even though there are variations in the display's components. For example the memory capacitor value can vary because of non-uniform dielectric thickness and/or electrode area. Variation in organic LED layer thickness results in sub-pixels with different organic LED device threshold voltages across the display. The spatial charge voltage remaining in the memory capacitor helps compensates for these different threshold voltages. Tolerances affecting sub-pixel size are automatically compensated by small changes in current density through the organic LED. Therefore, because the display brightness uniformity is controlled by the charge stored in its memory capacitors, it is not as important that manufacturing tolerances be as closely controlled.

Display Brightness Uniformity

The capacitor current memory structure uses external column data IC's for driving the column electrode. The currents from these crystalline silicon drivers will always be more accurate and stable than that of the TFT pixel circuits. Light output is directly proportional to the amount of charge stored in the memory capacitors C1. All sub-pixel memory capacitors C1 have the same charge added to them regardless of circuit variations. A more accurate charge stored in the memory capacitor results in better display brightness uniformity.

Adjustment to variation and/or changes in organic light-emitting diode threshold voltage is automatic. This is because after producing light by discharging the memory capacitor C1 through the organic light-emitting diode a spatial voltage equal to the threshold voltage of the organic LED remains on the memory capacitor C1. In subsequence display cycles charge is added to the memory capacitor C1 proportional to the desired display brightness.

Capacitor Current Memory Gray Scale

Gray scale is the accumulation of the light output from sub-frames. In each sub-frame, the pulse width modulation of a constant current source puts a precise charge in each sub-pixel memory capacitor. These charges are used to produce precise light output for gray scales. With gray scale, full color displays are obtained.

Memory Capacitor Capability of Storing One Complete Frame of Data

The memory capacitor is able to store enough charge during an address period to light the display for a complete frame period. Therefore, sub-field addressing and the resultant visual artifacts are eliminated.

Deep Color

This large display can be addressed at very high speed. This results in a 120 Hz frame rate capability. An extended color gamut and 16-bit depth per color is then possible.

Capacitor Current Memory Versus TFT Circuits for Active Matrix OLED/PLED Displays In accordance with this invention, there is provided a new driving method and structure for active-matrix OLED/PLED displays using a capacitor current memory circuit. This drive method and structure has cost and performance advantages over that of the TFT (thin film transistor) circuits. Active-matrix OLED/PLED displays using a capacitor current memory circuit have a wide manufacturing tolerance, while TFT circuits require close manufacturing tolerances. The drive method automatically adjusts for OLED/PLED threshold variation and changes, resulting in excellent display uniformity. It also provides for a front emission display with high aperture ratio that enables lower current density and longer life.

This reduces problems caused by dimensional instability of the plastic substrate due to thermal expansion and/or moisture absorption. The simple structure and low process temperatures of the capacitor current memory method makes possible roll to roll manufacturing on plastic substrates.

The TFT circuits constant current source is located in each pixel and requires four or more transistors for acceptable brightness uniformity. The capacitor current memory circuit uses external IC's column driver currents from crystalline silicon drivers that are more accurate and stable than TFT pixel circuits.

Some performance problems that TFT circuits have which the capacitor current memory circuit does not have include:
1. TFT switching effects including clock feedthrough and charge injection affecting the storage capacitor and cause output current error.
2. TFT circuits have motion blur due to after image effect when displaying moving images.
3. TFT circuits have limited dynamic range for input signal swing effecting OLED brightness range and gray scale.
4. TFT circuits typically do not have a reverse bias capability that increases display life.

Both drive methods can have a closed loop feedback that corrects for differential aging and temperature variations. However the TFT circuit's method is much more complex than that of the capacitor current memory circuit method. Also the TFT circuit optical feedback method is not manufactured with a feedback uniformity that meets the display performance requirements and that the circuitry will fit into the pixel size.

TFT Circuits Structure

The structure of an active matrix OLED/PLED display using the capacitor current memory is much simpler than that of the TFT circuit. TFT active matrix addressing has been used for generating constant current for an OLED/PLED display, but require complex patterning. TFT circuits of four or more transistors are used to meet the brightness uniformity required for large displays.

The TFT active-matrix OLED/PLED display can be configured as either a bottom or top emission type. In the bottom emission type, TFT circuits occupy part of the sub-pixel, which reduces the aperture ratio. These lower aperture ratio pixels require higher current densities to get the desired luminous. Higher current densities contribute to reduced display life.

In the TFT display for a top emission type, TFT circuits are under the light emitting layers. A second interlayer insulating film (planarizing film) is formed on the first passivation film to level out a level difference caused by the TFTs. It is very important to level out the level difference caused by the TFT using the second interlayer insulating film. The light emitting layers to be formed later are thin such that the existence of a level difference may lead to inferior light emission. Therefore, planarization before formation of a pixel electrode is required so that the light emitting layers can be formed on a surface as flat as possible.

When comparing the capacitor current memory structure to that of the TFT circuit, the capacitor current memory structure does not have a planarizing film because the electrode surface for the organic luminescent layers for the capacitor current memory structure is already flat. Therefore, a planarizing film process is not needed. This structure with its reduced processing simplifies roll to roll manufacturing.

Display Uniformity

The capacitor current memory uses a simple circuit that automatically adjusts for OLED/PLED threshold variation and changes, which results in excellent display uniformity.

Capacitor Current Memory Method Display Uniformity

The capacitor current memory structure uses external IC's (integrated circuits) for the column driver. The currents from these crystalline silicon drivers are more accurate and stable than that of the TFT pixel circuits. Light output is directly proportional to the amount of charge stored in the memory capacitors. Therefore, using a more accurate current source results in better display uniformity. Adjustment to light emitting diode threshold variation and changes is automatic. After light is produced by discharging the memory capacitor through the light emitting diode, a spatial voltage equal to the threshold voltage of the light emitting diode remains on the memory capacitor. In subsequence display cycles, charge is added to the memory capacitor proportional to the desired display brightness.

Manufacturing non-uniformity has a lesser effect on display uniformity when using the capacitor current memory structure compared to TFT circuits. For example, the memory capacitor value can vary 50% and still not affect the display uniformity. Tolerances affecting sub-pixel size are automatically compensated by small changes in current density through the light emitting device for variations in the pixel sizes. This is because the display uniformity is controlled by the charge stored in the memory capacitor; therefore it is not necessary that pixel manufacturing tolerances be as closely controlled to maintain brightness uniformity.

TFT Circuit Display Uniformity

To obtain uniform images on TFT active matrix OLED/PLED displays, it is necessary to ensure uniformity in the brightness of each pixel. This brightness is dependent on the current in the OLED/PLED device that is driven by each pixel circuit. An important issue for TFT active matrix OLED/PLED displays has been the pixel driving technology needed to achieve uniformity in OLED/PLED currents. The main difficulty is non-uniformity in the current/voltage characteristics of the TFTs that form part of the pixel circuit.

The capacitor current memory method achieves a "current memory" that supplies continuous forward current to the OLED/PLED device. However, the memory requirements of a TFT active matrix OLED/PLED display cannot be achieved using a "current memory", as these do not exist for this circuit, but must be achieved by storing a voltage in a capacitor that represents the required current.

Voltage programmed circuits suffer from non-uniformity issues. In LTPS-TFT technology, the variations of device characteristics (mainly on threshold voltage) caused by device aging or manufacturing process are unavoidable. Simple pixel driver schemes with two transistors per pixel are sensitive to threshold voltage variations. Schemes with four transistors per pixel have therefore been proposed. The multitransistor pixel circuit structure is capable of an improved adjustment of the variation of threshold voltage. Self-compensating current program methods compensate not only threshold voltage, but also mobility distribution.

Some of the non-uniformity issues are caused by lack of dynamic range limiting signal swing at the input. When the input is low, the threshold voltage of the drive transistor affects low gray scale levels. Switching effects include clock feedthrough and charge injection affecting the storage capacitor causing output current error. Second order crosstalk affect display uniformity. Another important display uniformity issue is registration of multimask patterns on plastic substrates.

Differential Aging

The power efficiency of pixels in a display will drift over time due to operational degradation. The individual pixels in a display may then exhibit different aging in accordance with their use. The brightness non-uniformities due to the differential aging will reduce the useful display lifetime.

Feedback

Using a feedback circuit that can correct for degradation caused by differential aging extends the useful display life.

Spatial Charge Voltage Feedback

A ramp waveform is used to force the discharge of the memory capacitor through the OLED/PLED device. The discharge stops when the remaining voltage on the memory capacitor, after the ramp waveform ends, becomes equal to the threshold voltage of the light emitting diode. This spatial charge voltage on the memory capacitor is indicative of the threshold voltage of the OLED/PLED device. It has been recognized that as the OLED/PLED display element degrades over time, its impedance increases and the potential difference between its anode and cathode increases. The value of the change in potential difference provides a reasonable indication of the state of the element in terms of its light emission/drive current characteristics. Thus by using feedback of this voltage to adjust the amount of charge stored in each memory capacitor, compensation for temperature and aging degradation is possible.

Optical Feedback

An optical feedback is used in the TFT active-matrix drive. Ideally this circuit will automatically compensate for OLED/PLED device non-uniformity and degradation; however, the uniformity issues now rest with the opto-coupling efficiency and the driving transistor threshold voltage variation.

Display Life

Over time, efficiency and effectiveness of an OLED/PLED display changes and the quality of the display declines, particularly for sensitive applications such as imaging. This decrease in quality is due to changes over time in the materials comprising the display, degradation in electronic components, and the like.

Encapsulation

An important factor that affects the lifetime of both drive methods is the encapsulation of the display. An encapsulation in an inert atmosphere has to be used in order to protect the display from oxygen and humidity diffusing into the layers.

Lower Forward Current

The capacitor current memory method is a front emission type display. The resultant very high aperture ratio has lower current density. Lower current density increases display life by less heating of the OLED/PLED element and less metal migration.

Reverse Bias

It is known that application of reverse bias to an organic electroluminescence element is an effective means to increase the life of the display. Most TFT active-matrix circuits do not do this. The capacitor current memory circuits reverse biases to the organic light emitting diode with neither substantial increase in power consumption nor increase in cost.

Cooled Passively

In this invention, most of the electronic drive circuitry is external to the display area so that any heat generated tends to be externally dissipated. Furthermore, the display structure has the capability to conduct heat laterally out of the display. The wide opaque row electrodes are good electrical conductors and also serve as good thermal conductors allowing heat to be conducted laterally and/or vertically out of the display.

For large TFT circuit displays, heat can be can be readily conducted laterally out of the display, but will have to be dissipated out of the front and back surfaces. If the heat from power dissipated in the TFT circuit and the OLED/PLED device has a poor releasing action, then degradation of the TFT or degradation of the OLED/PLED device results.

Gray Scale

Gray scale non-uniformity of the TFT active matrix circuit is still a fundamental problem that must be solved. In order to achieve the gray scale uniformity of the OLED/PLED display, the current to voltage (I-V) characteristic of each OLED/PLED element must be uniform, but such is hard to obtain. Therefore, the technical solution of this problem is very important for high quality display.

Capacitor Current Memory Gray Scale

Gray scale is the accumulation of the light output from sub-frames. In each sub-frame the pulse width modulation of a constant current source puts a precise charge in the memory capacitor of each pixel. These charges are used to produce the precise light output for gray scales. Full color displays (16.7 million colors) are easily obtained.

TFT Active Matrix Gray Scale

To obtain uniform images current programming a pixel circuit is programmed by means of analog gray-scale data current via a data line in order to compensate for variations in threshold voltages and mobility values of the TFTs. While this does offer the advantage of high uniformity in OLED/PLED currents, it also suffers from some serious drawbacks. Specifically, the lowness of its current for a dark gray-scale means that 1) programming time will be relatively long, and 2) a highly accurate current data driver will be required. The limited dynamic range of the TFT circuits signal swing at the input, means that the OLED/PLED brightness adjustment range is limited. Motion blur is due to afterimage effect when displaying moving images. To correct this an additional horizontal address line to reset the storage capacitor is needed.

SUMMARY

The new drive method eliminates obstacles to the manufacture of very large area organic LED displays on plastic substrates. It has the capability for manufacturing low power very large area organic LED displays with reduced cost and increased performance that cannot be matched by other active matrix drive methods.

The foregoing description of various preferred embodiments of the invention has been presented for purposes of illustration and description. It is not intended to be exhaustive or to limit the invention to the precise forms disclosed. Obvious modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims to be interpreted in accordance with the breadth to which they are fairly, legally, and equitably entitled.

The invention claimed is:

1. In an active matrix organic LED pixel display having a multiplicity of light-emitting pixels and electronic drive circuitry for selectively addressing said pixels, each pixel containing an organic LED, said display comprising a matrix of pixels connected by row scan electrodes and column data electrodes, each pixel having a MEMS switching device and a memory capacitor, the improvement wherein each said MEMS switching device and each said memory capacitor for each pixel are located on a different plane relative to the plane of the organic LED for each said pixel so as to maximize the aperture ratio of the pixel and reduce the current density in the pixel.

2. The invention of claim 1 wherein the electronic drive circuitry provides an off-set voltage to the front electrode, said voltage controlling the voltage level at which the discharge current initially flows from the memory capacitor through the organic LED.

3. The invention of claim 1 wherein a common electrode covers the entire front surface of all of the organic LED pixels so as to seal the front surface of each organic LED pixels from exposure to air and/or moisture.

4. The invention of claim 1 wherein the electronic drive circuitry includes a column data electrode IC for providing a constant current source and a pulse width modulation switch controlling a predetermined amount of charge to be stored in the memory capacitor and supplying a predetermined amount of charge to be stored in the memory capacitor.

5. The invention of claim 1 wherein the electronic circuitry includes a power supply which recovers a substantial portion of the energy driving the organic LED to produce light.

6. The invention of claim 1 wherein the memory capacitor recovers a substantial portion of the energy driving the MEMS switching device.

7. The invention of claim 1 wherein each MEMS device has an off position between the addressing and the light emission.

8. The invention of claim 1 wherein the display life is improved by sealing each organic LED pixel against exposure to oxygen and/or moisture with a metal electrode covering the entire front surface area of said organic LED and said row scan electrodes covering most of the rear surface area of said display.

9. In an active matrix organic LED display having a multiplicity of light-emitting pixels and electronic drive circuitry for selectively addressing said pixels, each pixel containing an organic LED, said display comprising a matrix of pixels connected by row scan electrodes and column data electrodes, which comprises increasing the life of the display by covering the entire front surface of all of the organic LED pixels with a common electrode so as to seal the front surface of the organic LED pixels against exposure to air and/or moisture.

10. The invention of claim 9 wherein the electronic drive circuitry provides an off-set voltage to the front electrode, said voltage controlling the voltage level at which the discharge current initially flows from the memory capacitor through the organic LED.

11. The invention of claim 9 wherein the electronic drive circuitry includes a column data electrode IC for providing a constant current source and a pulse width modulation switch controlling a predetermined amount of charge to be stored in the memory capacitor and supplying a predetermined amount of charge to be stored in the memory capacitor.

12. The invention of claim 9 wherein the electronic circuitry includes a power supply and the energy driving the organic LED to produce light is substantially recovered in the power supply.

13. The invention of claim 9 wherein the energy that drives the MEMS switching device is recovered in the memory capacitor.

14. The invention of claim 9 wherein each MEMS device has an off position between the addressing and the light emission.

15. The invention of claim 9 wherein each MEMS device and each memory capacitor for each pixel are located on a different plane relative to the organic LED for each pixel.

16. In a method for operating an active matrix organic LED comprising a multiplicity of light-emitting pixels and electronic drive circuitry for selectively addressing said pixels, each pixel containing an organic LED, a MEMS switching device and a memory capacitor, said display including row scan electrodes and column data electrodes that interconnect the matrix pixels with a MEMS switching device and a memory capacitor for each pixel, the improvement wherein said MEMS switching device connects said memory capacitor to a column data electrode during addressing of a pixel and wherein said MEMS switching device connects said memory capacitor to said organic LED of said pixel during light emission, each said MEMS device having an off position between addressing and light emission.

17. The invention of claim 16 wherein the electronic circuitry includes a power supply and the energy driving the organic LED to produce light is substantially recovered in the power supply.

18. The invention of claim 16 wherein the energy that drives the MEMS switching device is recovered in the memory capacitor.

19. The invention of claim 16 wherein the electronic drive circuitry provides an off-set voltage to the front electrode, said voltage controlling the voltage level at which the discharge current initially flows from the memory capacitor through the organic LED.

20. The invention of claim 16 wherein a common electrode covers the entire front surface of all of the organic LED pixels so as to seal the front surface of each organic LED pixel from exposure to air and/or moisture.

* * * * *